US009972971B2

United States Patent
Nakanishi

(10) Patent No.: US 9,972,971 B2
(45) Date of Patent: May 15, 2018

(54) SURFACE EMITTING LASER, INFORMATION ACQUISITION APPARATUS, AND IMAGING APPARATUS

(71) Applicant: CANON KABUSHIKI KAISHA, Tokyo (JP)

(72) Inventor: Koichiro Nakanishi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days. days.

(21) Appl. No.: 15/208,385

(22) Filed: Jul. 12, 2016

(65) Prior Publication Data

US 2017/0018908 A1  Jan. 19, 2017

(30) Foreign Application Priority Data

Jul. 13, 2015  (JP) ................................. 2015-140050
Jul. 13, 2015  (JP) ................................. 2015-140051

(51) Int. Cl.
*H01S 5/18*  (2006.01)
*H01S 5/183*  (2006.01)
*G01B 9/02*  (2006.01)
*H01S 5/10*  (2006.01)

(52) U.S. Cl.
CPC ...... *H01S 5/18361* (2013.01); *G01B 9/02004* (2013.01); *G01B 9/02091* (2013.01); *H01S 5/18366* (2013.01); *H01S 5/105* (2013.01); *H01S 5/18311* (2013.01)

(58) Field of Classification Search
CPC .............. H01S 5/18; H01S 5/183; H01S 5/187
See application file for complete search history.

(56) References Cited

U.S. PATENT DOCUMENTS

| 8,059,690 | B2 | 11/2011 | Chang-Hasnain et al. |
| 8,189,643 | B2 | 5/2012 | Chang-Hasnain et al. |
| 2010/0309536 | A1* | 12/2010 | Akanuma .......... G02B 26/0858 359/200.8 |
| 2011/0280269 | A1* | 11/2011 | Chang-Hasnain ..... B82Y 20/00 372/50.1 |
| 2014/0268050 | A1* | 9/2014 | Jayaraman ......... G01B 9/02004 351/206 |

FOREIGN PATENT DOCUMENTS

| JP | 2004-273906 A | 9/2004 |
| JP | 2012-108371 A | 6/2012 |

OTHER PUBLICATIONS

Hor Ansbæk, et al., "1060-nm Tunable Monolithic High Index Contrast Subwavelength Grating VCSEL", IEEE Photonics Technology Letters, vol. 25, No. 4, p. 365-367, Feb. 15, 2013.

* cited by examiner

*Primary Examiner* — Jonathan Hansen
(74) *Attorney, Agent, or Firm* — Canon USA, Inc. I.P. Division

(57) ABSTRACT

A surface emission laser includes a first beam, a second reflector disposed in an opening portion formed in the first beam, and a second beam disposed in the opening portion, and extending in a widthwise direction of the first beam to connect the second reflector and the first beam, wherein a length, in a longitudinal direction of the first beam, of the second beam is smaller than a length, in the longitudinal direction of the first beam, of the second reflector.

23 Claims, 6 Drawing Sheets

SURFACE EMITTING LASER, INFORMATION ACQUISITION APPARATUS, AND IMAGING APPARATUS

BACKGROUND OF THE INVENTION

Field of the Invention

The present disclosure relates to a surface emission laser, an information acquisition apparatus, and an imaging apparatus.

Description of the Related Art

In recent years, the research and development of tunable lasers with variable oscillation wavelengths s actively performed because such tunable lasers can be expected to be applied to various fields such as the optical communication field and the examination field. The configuration of moving one of a pair of reflectors of a vertical cavity type surface emission laser (vertical cavity surface emission laser: hereinafter, referred to as a "VCSEL") is developed as a tunable laser. Specifically, by mechanically moving one (movable mirror) of a pair of reflectors using the Micro Electro Mechanical Systems (hereinafter, referred to as "MEMS") technique, a cavity length is varied, and the oscillation wavelength of the VCSEL is changed. Such a VCSEL will be hereinafter referred to as an "MEMS-VCSEL".

A High index Contrast subwavelength Grating (hereinafter, referred to as an "HCG") in which a subwavelength grating is formed in high refraction index material can be used as a movable mirror. In "1060-nm Tunable Monolithic High Index Contrast Subwavelength Grating VCSEL" (Thor Ansbak and 3 others, IEEE PHOTONICS TECHNOLOGY LETTERS, VOL. 25, NO. 4, p. 365-367, Feb. 15, 2013), an MEMS-VCSEL using an HCG as a movable mirror is disclosed. Furthermore, in "1060-nm Tunable Monolithic High Index Contrast Subwavelength Grating VCSEL" (Thor Ansbak and 3 others, IEEE PHOTONICS TECHNOLOGY LETTERS, VOL. 25, NO. 4, p. 365-367, Feb. 15, 2013), the following configuration is disclosed. An HCG is formed of a semiconductor having conductivity, and the HCG is pulled toward the side of an active layer by electrostatic attractive force.

If the HCG formed of the conductive semiconductor is pulled toward the active layer side, the HCG may be deformed by the electrostatic attractive force, and the oscillation of a VCSEL may be inhibited. In other words, if electrostatic attractive force is applied to the HCG, the electrostatic attractive force acts on the HCG itself. Thus, in addition to reducing a distance between the HCG and the active layer, the electrostatic attractive force causes the shape of the HCG itself to easily deform to be a shape protruded toward the active layer side. Accordingly, the reflection direction of light from the active layer changes, and substantial reflectance declines. This leads to an increase in lasing threshold, so that oscillation of the VCSEL is inhibited.

SUMMARY OF THE INVENTION

An object of the present disclosure is to provide a surface emission laser that can reduce the shape change of a movable mirror during driving.

A surface emission laser according to the present disclosure includes: a first reflector; an active layer disposed on the first reflector; a first beam disposed on the active layer via a space; a second reflector disposed in an opening portion formed in the first beam; and a second beam disposed in the opening portion, and extending in a widthwise direction of the first beam to connect the second reflector and the first beam, wherein both ends, at least in a longitudinal direction, of the first beam are fixed ends, and wherein a length, in the longitudinal direction of the first beam, of the second beam is smaller than a length, in the longitudinal direction of the first beam, of the second reflector.

In addition, a surface emission laser according to the present disclosure includes: a first reflector; an active layer disposed on the first reflector; a beam disposed on the active layer via space; and a second reflector supported by the beam, wherein the surface emission laser has such a structure that, in a state in which a first beam is pulled toward a side of the active layer, deformation in an in-plane direction of the second reflector becomes smaller than deformation in an in-plane direction of the beam excluding a region in which the second reflector is disposed.

According to other aspects of the present disclosure, one or more additional surface emitting lasers, one or more information acquisition apparatuses and one or more imaging apparatuses are discussed herein. Further features of the present disclosure will become apparent from the following description of exemplary embodiments (with reference to the attached drawings).

According to the present disclosure, a surface emission laser with a suppressed shape change of a movable mirror during driving can be obtained.

DESCRIPTION OF THE EMBODIMENTS

Figure 4A:
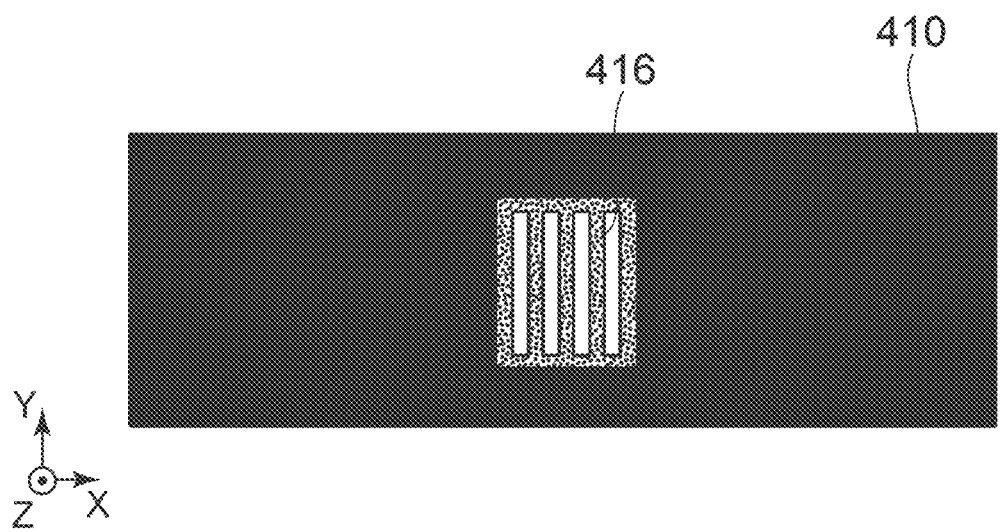
FIGS. 4A and 4B are diagrams for describing an issue.

First, an issue will be described using FIGS. 4A and 4B. FIG. 4A is a top surface schematic diagram illustrating a beam 410 on which a reflector 416 formed of an HCG is directly formed. This reflector 416 is used as a movable mirror of an MEMS-VCSEL.

Figure 4B:
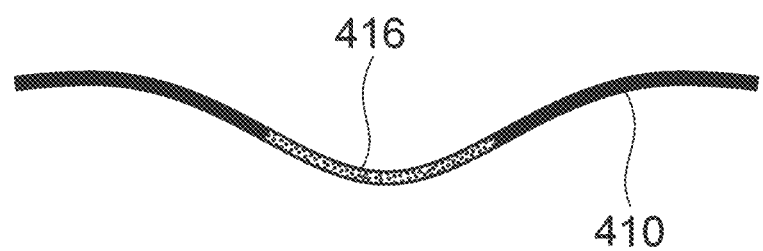

FIG. 4B is a diagram illustrating the state of the reflector 416 and the beam 410 during driving, viewed in a widthwise direction (Y-direction) of the beam. As illustrated in FIG. 4B, the central part in a longitudinal direction (X-direction) of the beam 410 and the reflector 416 at the central part are pulled toward the side of an active layer (not illustrated) (−Z-direction) by electrostatic attractive force. This is because the reflector 416 and the beam 410 have conductivity, and furthermore, the both ends in the X-direction of the beam 410 are fixed. As a result, a deformation amount varies in the reflector 416, and deformation is caused to be a shape protruded toward the active layer side, as illustrated in FIG. 4B. Accordingly, the reflection direction of light from the active layer changes, and substantial reflectance declines. Such a decline in reflectance leads to an increase in lasing threshold, so that oscillation of a VCSEL is inhibited.

In the present disclosure, there is provided a deformation suppressing structure for suppressing such deformation of movable mirror during driving. Specifically, the following configuration is employed. A region in which a movable mirror is connected to a beam is reduced. Furthermore, the movable mirror is configured in such a manner that electrostatic attractive force is not applied thereto. More specifically, a movable portion has such a configuration that an opening portion is formed in a first beam, of which both ends in the X-direction are fixed, the movable mirror is disposed within the opening portion, and the movable mirror and the first beam are connected only by a second beam. A length in a longitudinal direction of the first beam of the second beam is smaller than a length in the longitudinal direction of the first beam of the movable mirror. Furthermore, the movable mirror and an electrode disposed on the first beam are not electrically connected, or the movable mirror and the first beam having conductivity are not electrically connected. In addition, the configuration of the movable portion is not necessarily limited to the fixed configuration so long as the both ends in the X-direction are fixed ends.

Exemplary embodiments of the present disclosure will be described below with reference to the drawings. First of all, terms used in this specification will be defined. When upper and lower directions of an MEMS-VCSEL structure are mentioned in this specification, a substrate side is defined as a lower side, and an opposite side of the substrate is defined as an upper side.

In addition, the X-direction is the longitudinal direction of the first beam, and the Y-direction is the widthwise direction of the first beam. Furthermore, the Z-direction is a thickness direction of the active layer, that is to say, a direction in which the first reflector, the active layer, and the second reflector constituting the MEMS-VCSEL are disposed in this order.

In addition, the following description will be given using an HCG as an example of a movable mirror. The present disclosure, however, is not limited to this. For example, the present disclosure is applicable to the case of using a semiconductor multilayer film as a movable mirror.

First Exemplary Embodiment

Figure 1A:
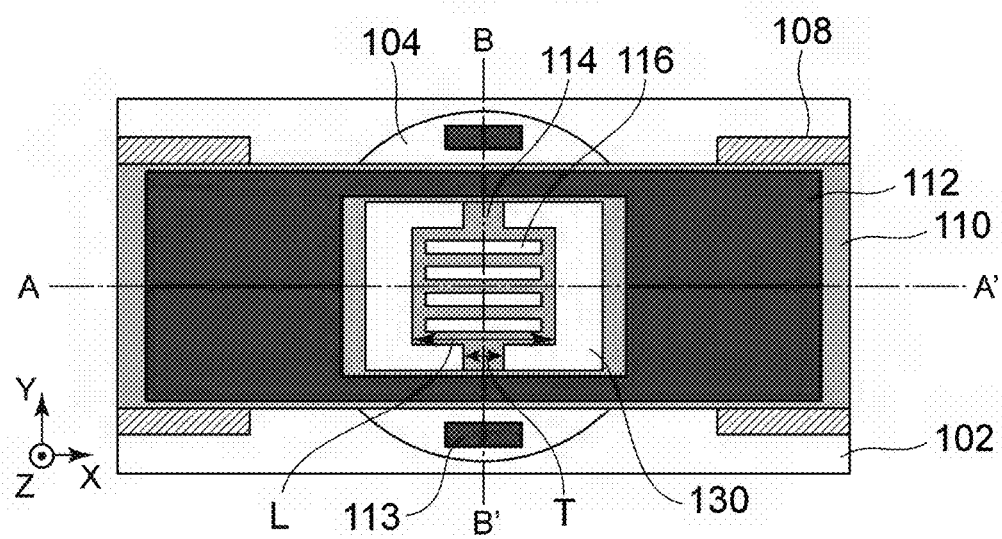
FIGS. 1A to 1C are schematic diagrams illustrating an example of an MEMS-VCSEL according to a first exemplary embodiment.
Figure 1B:
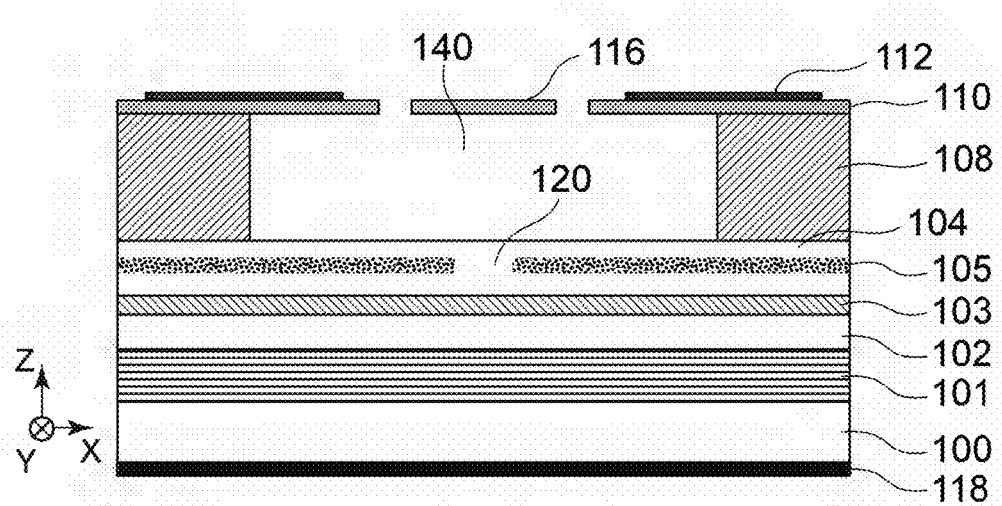

FIG. 1A is a top surface schematic diagram illustrating an example of an MEMS-VCSEL, which is an example of a wavelength variable type surface emission laser according to the present exemplary embodiment. FIG. 1B is a cross-sectional schematic diagram illustrating an example of the VCSEL according to the present exemplary embodiment. FIG. 1B corresponds to Cross-Sectional Diagram A-A' of FIG. 1A.

As illustrated in FIG. 1B, the MEMS-VCSEL includes, on a substrate 100, a lower reflector (first reflector) 101, a lower spacer layer 102, an active layer 103, an upper spacer layer 104, a current confinement layer 105, a supporting layer 108, and a movable portion. The movable portion includes an upper reflector (second reflector) 116 and a first beam 110, which is driven in the Z-direction, and of which both ends at least in the X-direction are fixed.

Furthermore, as illustrated in FIG. 1A, the movable portion includes a second beam 114 connecting the upper reflector 116 and the first beam 110. The upper reflector 116 is a movable mirror, and is disposed in an opening portion 130 of the first beam 110. In addition, the upper reflector 116 is supported on the first beam 110 by the second beam 114 extending in the Y-direction of the first beam 110.

As illustrated in FIG. 1B, a space 140 is formed between the upper reflector 116 and the upper spacer layer 104. The first beam 110 is supported by the supporting layer 108. In addition, a first electrode 118 is formed below the substrate 100. A second electrode 112 is formed on the first beam 110.

In addition, a third electrode 113 is formed on the upper spacer layer 104 (refer to FIG. 1A). By applying voltage to between the first electrode 118 and the third electrode 113, an electron is supplied from the first electrode 118 to the active layer 103 via the substrate 100, the lower reflector 101, and the lower spacer layer 102. On the other hand, a hole is supplied from the third electrode 113 to the active layer 103 via the upper spacer layer 104 and a low resistance region 120 of the current confinement layer 105. As a result, the electron and the hole are recombined in the active layer 103, and light emission occurs in the active layer 103.

In addition, the third electrode 113 is an electrode that forms a pair with the second electrode 112 for driving the first beam 110. In other words, by applying alternating-current voltage to between the second electrode 112 and the third electrode 113, the first beam 110 oscillates in the Z-direction. As a result, the upper reflector 116 also oscillates in the Z-direction, and a cavity length of a pair of reflectors constituted by the lower reflector 101 and the upper reflector 116 varies. Accordingly, in the light emitted in the active layer 103, light with a specific wavelength corresponding to the cavity length is emitted to the outside. In this manner, the oscillation wavelength of the surface emission laser becomes variable.

In the present exemplary embodiment, the upper reflector 116 is supported by the first beam 110 and the second beam 114. In addition, the upper reflector 116 is not supported by the first beam 110 in the X-direction. As illustrated in FIG. 1A, a length T in the X-direction of the first beam 110 of the second beam 114 is smaller than a length L, in the X-direction of the upper reflector 116. Furthermore, the upper reflector 116 is configured not to be electrically connected to the second electrode 112 disposed on the first beam 110. Specifically, volume resistivities of the first beam 110, the second beam 114, and the upper reflector 116 are equal to or larger than $1 \times 10^5$ Ωcm. On the other hand, a volume resistivity of the second electrode 112 is equal to or less than $1 \times 10^2$ Ωcm. In other words, the volume resistivities of the first beam 110, the second beam 114, and the upper reflector 116 are larger than the volume resistivity of the second electrode 112 by $10^3$ times or more. The first beam 110, the second beam 114, and the upper reflector 116 do not contain dopant for enhancing carrier mobility. Alternatively, even if the first beam 110, the second beam 114, and the upper reflector 116 contain such dopant, a doping concentration is at such a degree as not to have a function of enhancing carrier mobility.

In addition, it is sufficient that the upper reflector 116 and the second electrode 112 are not electrically connected. Thus, it is sufficient that at least the volume resistivity of the second beam 114 is equal to or larger than $1 \times 10^5$ Ωcm. In other words, it is sufficient that a carrier path from the second electrode 112 to the upper reflector 116 is blocked even if the volume resistivities of the upper reflector 116 and the first beam 110 are less than $1 \times 10^5$ Ωcm. A scanning spreading resistance microscopy can be used as a method for measuring electrical resistance.

Figure 1C:
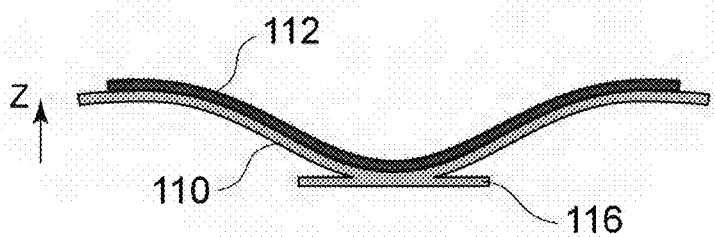

FIG. 1C is a diagram illustrating the movable portion during driving, viewed in the Y-direction. As seen from FIG. 1C, in a state in which the first beam 110 is Pulled toward the side of the active layer 103, the shape of a part of the first beam 110 at the central part in the X-direction of the first beam 110 differs from the shape of the upper reflector 116. Specifically, the distortion of the shape of the upper reflector 116 becomes smaller than that of the shape of the part of the first beam 110 at the central part in the X-direction of the first beam 110. This principle will be described below.

If voltage is applied to between the second electrode 112 and the third electrode 113, because the both ends in the X-direction of the first beam 110 are fixed, the central parts of the second electrode 112 and the first beam 110 are pulled toward the side of the active layer 103 by electrostatic attractive force. Thus, the first beam 110 deforms as illustrated in FIG. 1C.

On the other hand, because the upper reflector 116 is not electrically connected to the second electrode 112, the upper reflector 116 is not charged even if voltage is applied to between the third electrode 113 and the second electrode 112. In addition, because the upper reflector 116 is connected to the first beam 110 only via the second beam 114, the upper reflector 116 receives almost no influence of the deformation of the first beam 110. Thus, even if the first beam 110 deforms during driving as illustrated in FIG. 1C, the deformation of the upper reflector 116 is suppressed. As a result, a decline in reflectance that is caused by the deformation of the upper reflector 116 during driving is suppressed, and an increase in lasing threshold is suppressed, so that the VCSEL can be stably oscillated even during driving of the movable portion.

The opening portion 130 is positioned at the central part in the X-direction of the first beam 110. The second beam 114 connects the first beam 110 and the upper reflector 116 at the central part in the X-direction of the first beam 110 of the opening portion 130. The upper reflector 116 disposed in the opening portion 130 is disposed at a position corresponding to a light emission region of the active layer 103.

The length T in the X-direction of the second beam 114 is preferably equal to or less than ⅓ of the length L in the X-direction of the first beam 110 in that the influence of the deformation of the first beam 110 during driving is not conveyed to the upper reflector 116. Furthermore, the length T in the X-direction of the second beam 114 is preferably equal to or less than ⅕, and more preferably equal to or less than ⅐ of the length L in the X-direction of the first beam 110. In addition, the length T in the X-direction of the second beam 114 is preferably equal to or larger than 1/20 of the length L in the X-direction of the upper reflector 116 in that the upper reflector 116 is retained on the first beam 110.

(Upper Reflector)

A high index contrast subwavelength grating (HCG) can be used as the upper reflector 116. With this configuration, using a manufacturing method to be described later, patterning can be performed through the same process as the patterning of the first beam 110 and the second beam 114. An HCG has a configuration in which high refractive index material (high refractive index portions) and low refractive index material (low refractive index portions) are alternately and periodically arranged in an in-plane direction. Examples of the HCG include a periodic structural body of high refractive index regions (AlGaAs portions) and low refractive index regions (space portions), in which periodic spaces are provided by processing a semiconductor layer such as an AlGaAs layer. For varying a wavelength at high speed, the upper reflector 116 serving as a movable mirror is required to be a light-weight reflector. It is therefore preferable to use an HCG. In addition, as the HCG, the ones described in "1060-nm Tunable Monolithic High Index Contrast Subwavelength Grating VCSEL" (Thor Ansbak and 3 others, IEEE PHOTONICS TECHNOLOGY LETTERS, VOL. 25, NO. 4, p. 365-367, Feb. 15, 2013), and the specifications of U.S. Pat. Nos. 8,059,690 and 8,189,643 can be used.

As illustrated in FIG. 1A, if the upper reflector 116 is formed by an HCG, the configuration in which a grating is periodically disposed in the X-direction of the first beam 110 is preferable because rigidity in the Y-direction of the upper reflector 116 can be increased, and deformation caused during driving can be more suppressed.

In addition, aside from the HCG, for example, a distributed Bragg reflector (hereinafter, referred to as "DBR") in which high refractive index layers and low refractive index layers are alternately stacked with an optical thickness ¼ wavelength can also be used. As an upper reflector, any of a DBR formed of a semiconductor and a DBR formed of a dielectric may be used. Generally, a DBR formed of a dielectric can easily increase a refractive index difference between high refractive index layers and low refractive index layers, as compared with a DBR formed of a semiconductor. Thus, the DBR formed of a dielectric can achieve high reflectance with less number of stacked layers. On the other hand, the DBR formed of a semiconductor has advantages in process though the number of pairs becomes large. For example, films can be simultaneously formed during crystal growth, and current can flow by doping. $Al_{0.4}Ga_{0.6}As$ and $Al_{0.9}Ga_{0.1}As$ can be used as semiconductor DBRs, and silicon oxide and titanium oxide (or tantalum oxide) can be used as dielectric DBRs.

An area of the upper reflector 116 is preferably larger than an area of the light emission region from the aspect of light utilization efficiency. In addition, the upper reflector 116 preferably has insulation property.

(First Beam)

The first beam 110 is fixed at 2 points at least in the X-direction. Structures for mitigating distortion caused during crystal growth and stress attributed to an operating environment temperature may be formed on the first beam 110. The opening portion 130 for disposing the upper reflector 116 is formed in the first beam 110. The opening portion 130 is formed so as to correspond to the light emission region of the active layer 103. An area of the opening portion 130 is larger than an area of the light emission region.

GaAs-based material can be used for the first beam 110. In addition, the first beam 110 is preferably formed of the same semiconductor material as the second beam 114 and the upper reflector 116 for simplifying a process.

(Second Beam)

The second beam 114 is disposed in the opening portion 130 of the first beam 110 together with the upper reflector 116. In addition, the second beam 114 extends in the X-direction from the first beam 110 toward the upper reflector 116 to be connected to the upper reflector 116. One second beam 114 is disposed at each of 2 points. If the central axes of the 2 second beams 114 greatly differ, distortion force is applied to the upper reflector 116. Such force may cause the deformation of the upper reflector 116. It is therefore preferable to approximately match the central axes of the 2 second beams 114. In addition, it is preferable that the central axes of the 2 second beams 114 approximately match the central axis in the X-direction of the upper reflector 116. In addition, the approximate match refers to a state in which the deviation in the X-direction of the central axes is equal to or less than the half of the length in the X-direction of the second beam 114.

In addition, the second beams 114 may be disposed at 2 or more points. Nevertheless, for suppressing the influence of the deformation of the first beam 110, it is preferable to make a portion connected with the upper reflector 116 smaller. Thus, the number of the second beams 114 is preferably smaller. In addition, the range of the length in the X-direction of a region in which the second beams 114 are formed are the same as that in a case in which the second beams 114 are disposed only at 2 points.

The length in the Y-direction of the second beam 114 is preferably at the same level as the length in the X-direction of the second beam 114. The second beam 114 may have insulation property. In this case, similarly to the first beam 110, GaAs-based material can be used for the second beam 114.

(Second Electrode)

Single metal such as titanium, gold, and aluminum, alloy, or a stacked body of metal films can be used for the second electrode 112. In addition, it is sufficient that the second electrode 112 is formed to be connected to the first beam 110 in the X-direction. For reducing electrical resistance the second electrode 112, the second electrode 112 is preferably formed on the entire surface of the first beam 110. The second electrode 112 is not formed on the upper reflector 116.

(Space)

Generally, no solid exists in the space 140. Thus, the space 140 may be made vacuum by its atmosphere, or fluid such as air, inert gas, and liquid such as water may exist. In addition, the length in the Z-direction of the space 140 can be determined in consideration of a wavelength variable bandwidth and pull-in of a movable reflector. For example, in a case in which a wavelength varies within a wavelength variable bandwidth of 100 nm around 1060 nm with air in the space 140, the length of the space 140 is about 1 µm to 2 µm.

(Spacer Layer)

The spacer layers have conductivity. For example, the p-type upper spacer layer 104 is doped with an adequate amount of an acceptor such as Mg. On the other hand, the n-type lower spacer layer 102 is doped with an adequate amount of a donor such as Si. GaAs-based semiconductor material can be used for the spacer layers.

The spacer layer may be formed of a monolayer, or may be formed of a plurality of layers. In addition, a contact layer may be formed on a layer directly connected to the third electrode 113, or in a region in which the third electrode 113 is formed. A dopant density of the contact layer is preferably higher than the dopant density of the other upper spacer layer 104.

(Active Layer)

The active layer 103 is not especially limited. In the present exemplary embodiment, a current injection type is illustrated. Alternatively, a photoexcitation-type configuration may be employed. In the case of emitting light in a wavelength band near 850 nm, material having a quantum well structure made of $Al_nGa_{1-n}As$ ($0 \le n \le 1$) can be used. In addition, in the case of emitting light in a wavelength band near 1060 nm, material made of $In_nGa_{1-n}As$ ($0 \le n \le 1$), or the like can be used.

In addition, the active layer 103 preferably the one having sufficiently-wide gain. Specifically, the active layer 103 preferably has a gain in a wavelength region wider than a reflection bandwidth of the upper reflector 116 and the lower reflector 101. Examples of such an active layer include an active layer having a quantum well structure that can emit light with at least 2 or more different energy levels, i.e., a so-called asymmetric quantum well structure. In addition, the quantum well structure may be single quantum well structure or may be formed of a plurality of layers so as to have a multiple quantum well structure. The material and the structure of the active layer 103 according to the present exemplary embodiment can be appropriately selected according to a desired oscillation wavelength.

(Current Confinement Layer)

Through a selective oxidization process, the current confinement layer 105 is formed in such a manner that an oxidized region which is selectively oxidized functions as a high resistance portion, and a non-oxidized region which is not oxidized functions as a low resistance portion. An oxidized layer that is to become the current confinement layer 105 through the selective oxidization process is preferably an AlAs layer or an $Al_{0.98}Ga_{0.02}As$ layer with high Al composition ratio, for example. By selectively oxidizing the oxidized layer in high-temperature water vapor atmosphere, $Al_xO_y$ is formed, and the current confinement layer 105 formed. By controlling the shape of a non-oxidized layer, a light emission shape can be controlled.

The position of the current confinement layer 105 may be on the upper side or the lower side of the active layer 103 so long as the current confinement layer 105 is positioned between the space 140 and the lower reflector 101. In addition, a plurality of the current confinement layers 105 may be provided. In this case, the plurality of current confinement layers 105 may be on either one side of the upper side and the lower side of the active layer 103, or may be on the both sides.

(Lower Reflector)

The above-described DBR can be used for the lower reflector 101. Any of the DBR formed of a semiconductor and the DBR formed of a dielectric can be used as the lower reflector 101. In the case of using the semiconductor DBR as the lower reflector 101, a stacked film of GaAs and AlAs can be used. In addition, silicon oxide and titanium oxide (or tantalum oxide) can be used as the dielectric DBR. In addition, the HCG can also be used as the lower reflector 101.

(First and Third Electrodes)

Single metal such as titanium, gold, and aluminum, alloy, or a stacked body of metal films can be used for the first electrode 118 and the third electrode 113. For example, Ti/Au, AuGe/Ni/Au can be used as electrode material. In addition, instead of being on the lower side of the lower reflector 101, the first electrode 118 may be on the upper side of the lower reflector 101 so long as carrier can be injected.

In the present exemplary embodiment, the description has been given using a current injection type excitation method as an excitation method of the active layer 103. Alternatively, photoexcitation may be used. In this case, there is no need to provide the first electrode 118 and the current confinement layer 105.

(Manufacturing Method)

Next, an example of a manufacturing method of the MEMS-VCSEL according to the present exemplary embodiment will be described using FIGS. 2A to 2E. Each of the drawings illustrates schematic diagrams corresponding to Cross-Section A-A' and Cross-Section B-B' in FIG. 1A. In addition, the following description will be given using an example in which the upper reflector is formed of an HCG. Nevertheless, the upper reflector is not limited to this.

Figure 2A:
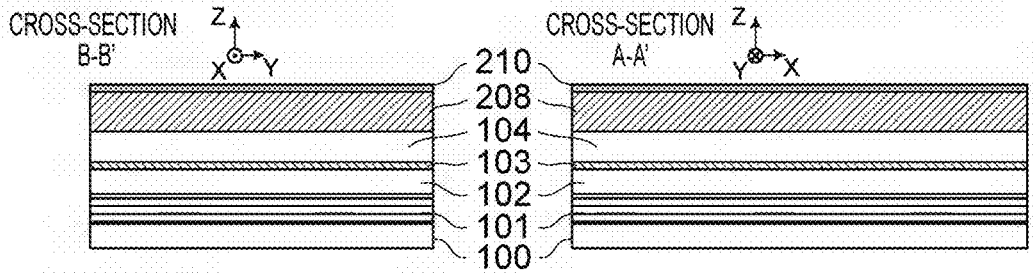
FIGS. 2A to 2E are schematic diagrams illustrating an example of a manufacturing method of the MEMS-VCSEL according to the first exemplary embodiment.

First, as illustrated in FIG. 2A, a structural body including, on the substrate 100, the lower reflector 101, the lower spacer layer 102, the active layer 103, the upper spacer layer 104, a sacrificial layer 208, and a beam precursor layer 210 is prepared. For preparing the structural body, each layer may be formed on the substrate 100, or may be purchased. Examples of the method for forming each layer include a method of performing crystal growth using a metalorganic chemical vapor deposition (MOCVD) or a molecular beam epitaxy (MBE). The beam precursor layer 210 is not doped with dopant such as Si for enhancing carrier mobility. A volume resistivity of the beam precursor layer 210 is preferably set to be equal to or larger than $1 \times 10^5$ Ωcm.

Figure 2B:
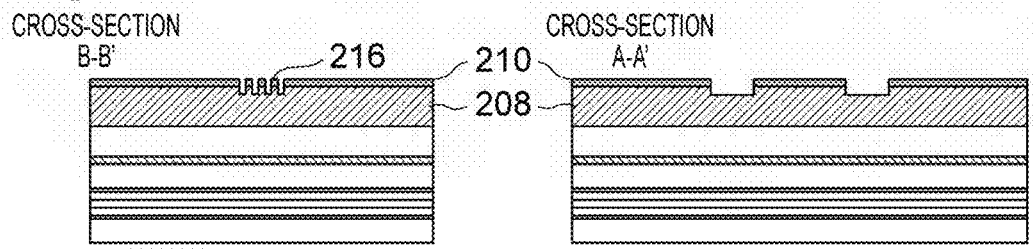

Next, as illustrated in FIG. 2B, portions of the beam precursor layer 210 excluding a portion 216 to become the upper reflector and the second beam and a portion to become the first beam are removed (refer to Cross-Sectional Diagram A-A'). In addition, portion of the beam precursor layer 210 that is to become a low refractive index portion of the HCG is also removed (refer to Cross-Sectional Diagram B-B'). A slit pattern to become the low refractive index portion of the HCG can be formed by an electron beam drawing apparatus. In addition, the removal process of the beam precursor layer 210 can be performed using dry etching. In addition, in FIG. 2B, not only the beam precursor layer 210 but also part of the sacrificial layer 208 is removed. Nevertheless, only the beam precursor layer 210 may be removed.

Figure 2C:
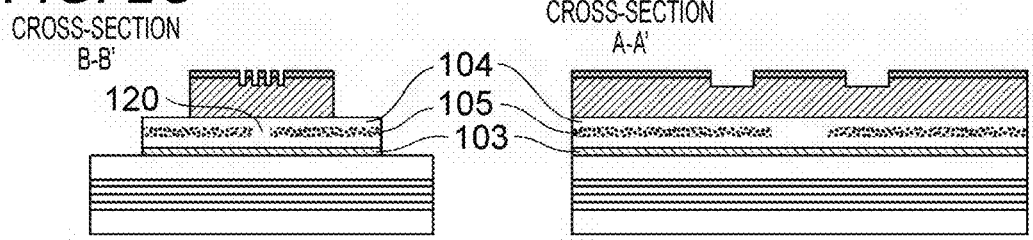

Next, as illustrated in FIG. 2C, the beam precursor layer 210 and part of the sacrificial layer 208 are removed while leaving a pattern corresponding to the movable portion (first beam, second beam, upper reflector). In this removal process, dry etching, wet etching, or a combination thereof may be used.

Then, the upper spacer layer 104 and part of the active layer 103 are removed while leaving a pattern for forming the third electrode on the upper spacer layer 104. In this removal process, photolithography and wet etching are used. In addition, in this removal process, in FIG. 2C, the side surface of the active layer 103 is exposed. Nevertheless, the side surface of the lower spacer layer 102, and furthermore, part or all of the side surface of the lower reflector 101 may be exposed. In this removal process, it is only required to expose the side surface of a layer to become the current confinement layer to be formed in the next process.

Next, in high-temperature water vapor atmosphere, a partial layer of the upper spacer layer 104 is oxidized from its side surface to form the current confinement layer 105 in the upper spacer layer 104. The low resistance region 120 of the current confinement layer 105 remains unoxidized. This low resistance region 120 corresponds to the light emission region in the active layer 103 and a portion of the beam precursor layer 210 that is to become the upper reflector.

Figure 2D:
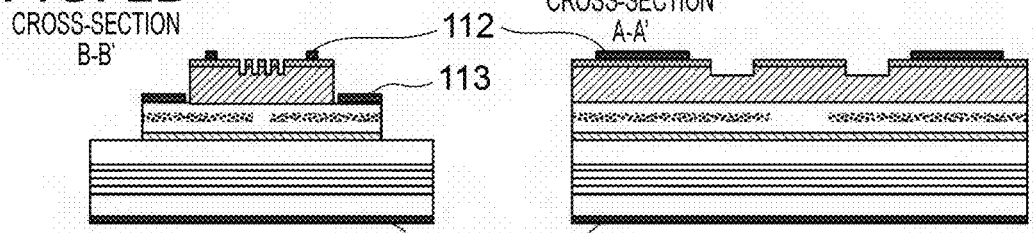

Next, as illustrated in FIG. 2D, the first electrode 118 is formed below the substrate 100, the second electrode 112 is formed above the portion to become the first beam, and the third electrode 113 is formed on the upper exposed surface of the upper spacer layer 104. The second electrode 112 is not formed on the upper reflector 116.

Figure 2E:
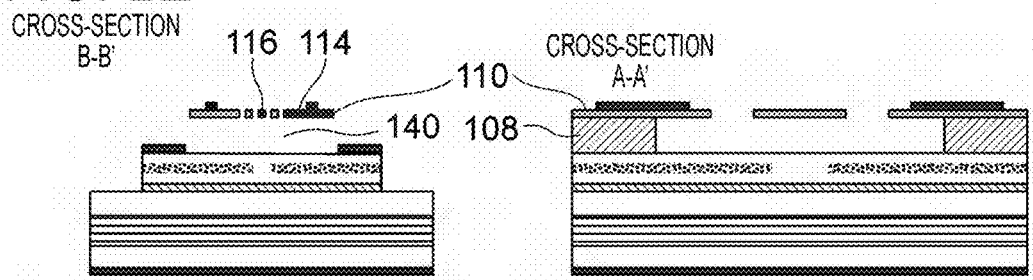

Lastly, as illustrated in FIG. 2E, the sacrificial layer 208 is removed while leaving a portion to become the supporting layer 108. As a result, the first beam 110, the second beam 114, the upper reflector 116, and the space 140 are formed. In this removal process, wet etching is used.

In addition, in any of the above-described removal processes, a mask layer may be appropriately provided. In addition, an MEMS-VCSEL manufactured using a method other than the above-described method is included in the present disclosure.

Second Exemplary Embodiment in the present exemplary embodiment, an example of an information acquisition apparatus using the surface emission laser according to the first exemplary embodiment as a light source device will be described. A wavelength variable type light source device can be used as an optical communication light source and an optical measurement light source. Furthermore, the wavelength variable type light source device can be used as a light source device of an information acquisition apparatus for acquiring internal information of a measurement target object non-invasively and nondestructively. An optical coherence tomography imaging apparatus (hereinafter, referred to as an "OCT apparatus") will be described below using FIG. 3, as an example of an information acquisition apparatus using the light source device according to the present exemplary embodiment.

Figure 3:
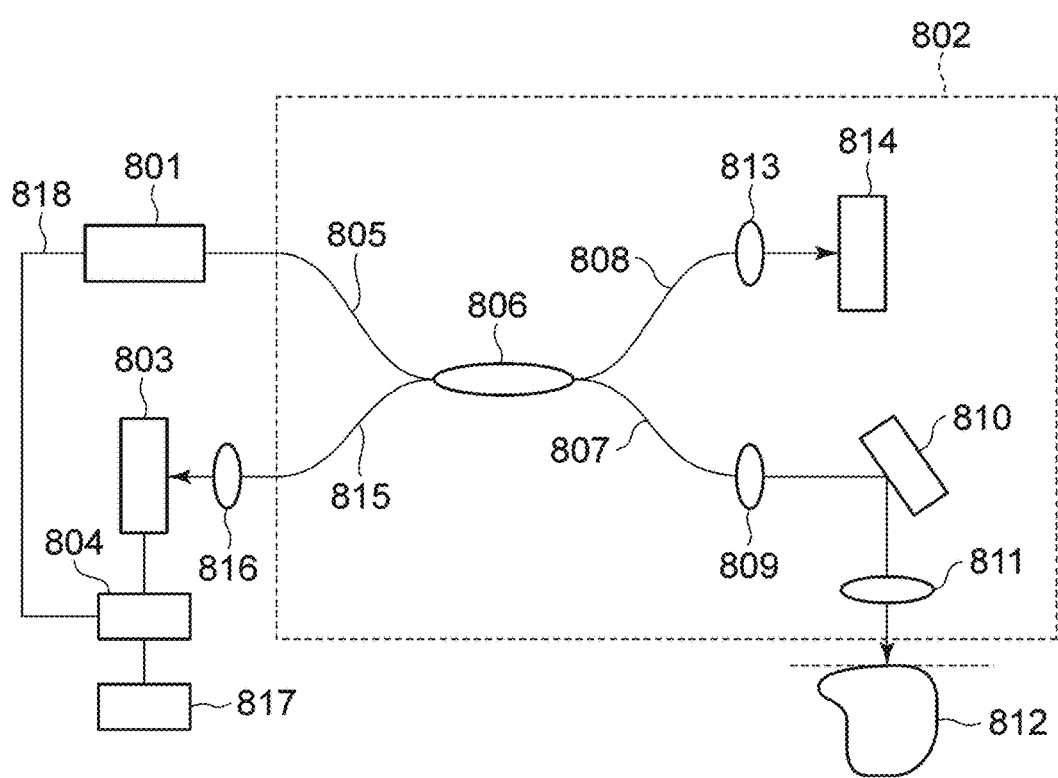
FIG. 3 is a schematic diagram illustrating an example of an imaging apparatus according to a second exemplary embodiment.

FIG. 3 is a schematic diagram illustrating an OCT apparatus according to the present exemplary embodiment. The OCT apparatus at least includes a light source device 801, an interference optical system 802, a light detection unit 803, and an information acquisition unit 804 for acquiring internal information of a measurement target object. The surface emission laser according to the first exemplary embodiment can be used as the light source device 801. In addition, the information acquisition unit 804 includes a Fourier transformer (not illustrated). Here, the configuration of the Fourier transformer included in the information acquisition unit 804 is not especially limited so long as the information acquisition unit 804 has a function of performing Fourier transform on input data. As an example case, the information acquisition unit 804 includes a calculation unit, and this calculation unit has a function of performing Fourier transform. Specifically, the calculation unit is a computer including a central processing unit (CPU), and this computer executes an application having a function of performing Fourier transform. As another example case, the information acquisition unit 804 includes a Fourier transform circuit having a function of performing Fourier transform.

Light emitted from the light source device 801 passes through the interference optical system 802 to be output as interfering light having information of a measurement target object 812. The interfering light is received by the light detection unit 803. In addition, the light detection unit 803 may be of a difference detection type or may be of a simple intensity monitoring type. Information of a time waveform of intensity of the received interfering light is transmitted from the light detection unit 803 to the information acquisition unit 804. The information acquisition unit 804 acquires a peak value of the time waveform of intensity of the received interfering light and performs Fourier transform to acquire information of the object 812 (e.g., information of a tomographic image).

The procedure from when light is emitted from the light source device 801 to when internal information of a measurement target object is obtained will be described in detail below. Light emitted from the light source device 801 passes through a fiber 805 to enter a coupler 806, and branches into illumination light passing through a fiber 807 for illumination light, and reference light passing through a fiber 808 for reference light. The coupler 806 can be configured to operate in single mode in a wavelength band of the light source, and various fiber couplers can be formed by 3 dB couplers. The illumination light passes through collimator 809 to become parallel light, and is reflected by a mirror 810. The light reflected by the mirror 810 passes through a lens 811 to be emitted onto the object 812, and is reflected from each layer in a depth direction of the object 812.

On the other hand, the reference light passes through a collimator 813 to be reflected by a mirror 814. In the coupler 806, interfering light is generated by reflected light from the object 812 and reflected light from the mirror 814. The interfering light passes through a fiber 815 and a collimator 816 to be collected and received by the light detection unit 803. Information of intensity of the interfering light received by the light detection unit 803 is converted into electrical information such as voltage, and is transmitted to the information acquisition unit 804. The information acquisition unit 804 processes the data of the intensity of the interfering light. Specifically, the information acquisition unit 804 performs Fourier transform to obtain information of a tomographic image. Normally, the data of intensity of interfering light to be subjected to Fourier transform is data sampled at an equal wavenumber interval. Alternatively, data sampled at an equal wavelength interval can be used.

The obtained information of the tomographic image may be transmitted from the information acquisition unit 804 to an image display unit 817 to be displayed as an image. In addition, by scanning the mirror 810 in a plane vertical to a direction in which the illumination light enters, a 3-dimensional tomographic image of the measurement target object 812 can be obtained. In addition, the light source device 801 may be controlled by the information acquisition unit 804 via an electrical circuit 818. In addition, the intensity of light emitted from the light source device 801 may be sequentially monitored and the obtained data may be used for amplitude correction of a signal of the intensity of interfering light, although this is not illustrated in the drawing.

The OCT apparatus is useful in the fields of ophthalmology, dentistry, dermatology, and the like, for acquiring a tomographic image of the inside of a biological object such as animals and humans. Information about a tomographic image of a biological object is not limited to a tomographic image of a biological object, and includes numerical value data necessary for obtaining a tomographic image. In particular, it is preferable that an eye fundus, a tooth, or a blood vessel of a human body is set as a measurement target, and the OCT apparatus is used for acquiring information about a tomographic image of such a measurement target.

In addition, a surface emission laser according to a third or fourth exemplary embodiment, which will be described later, can also be used as the light source device according to the present exemplary embodiment.

Third Exemplary Embodiment

An exemplary embodiment with a different configuration from that of the first exemplary embodiment will be described below using FIGS. 5A to 5C and 6A to 6E. In addition, in FIGS. 5A to 5C and 6A to 6E, the same members as those in the first exemplary embodiment are assigned the same reference numerals. The same members as those in the first exemplary embodiment can be used unless otherwise specified.

Figure 5A:
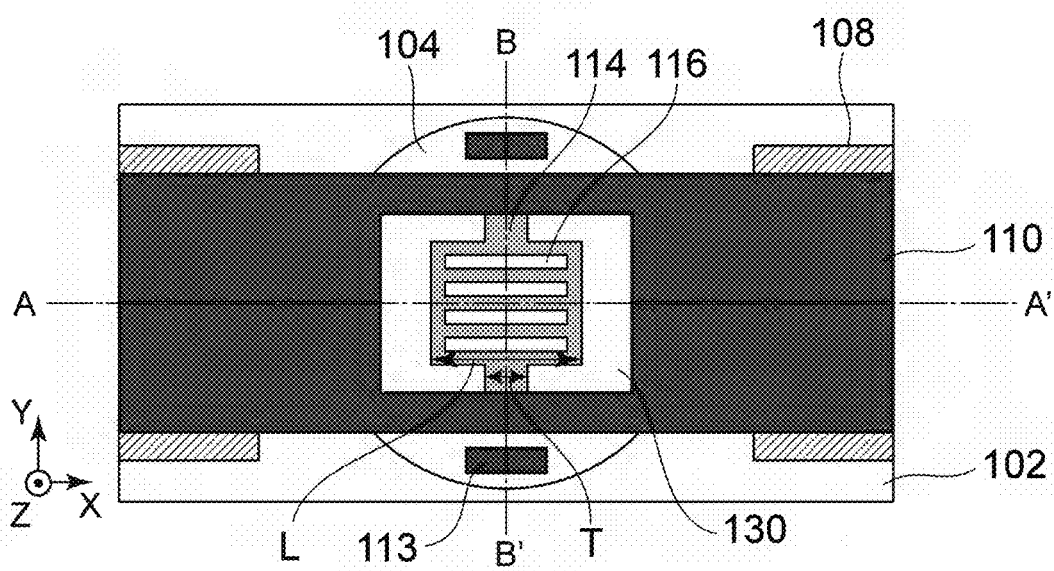
FIGS. 5A to 5C are schematic diagrams illustrating an example of an MEMS-VCSEL according to third and fourth exemplary embodiments.
Figure 5B:
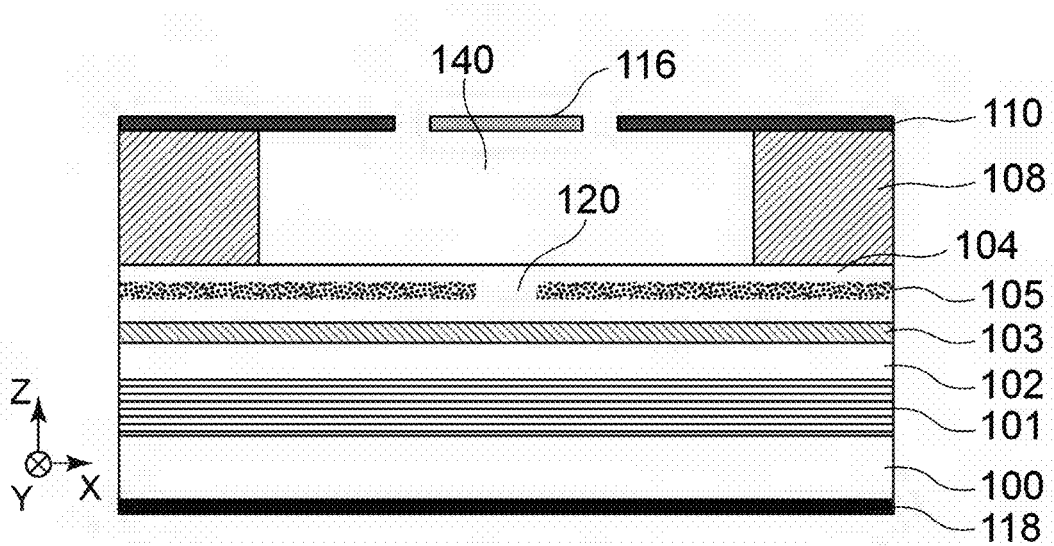

FIG. 5A is a top surface schematic diagram illustrating an example of an MEMS-VCSEL, which is an example of a wavelength variable type surface emission laser according to the present exemplary embodiment. FIG. 5B is a cross-sectional schematic diagram illustrating an example of the VCSEL according to the present exemplary embodiment. FIG. 5B corresponds to Cross-Sectional Diagram A-A' of FIG. 5A.

As illustrated in FIG. 5B, the MEMS-VCSEL includes, on the substrate 100, the lower reflector (first reflector) 101, the lower spacer layer 102, the active layer 103, the upper spacer layer 104, the current confinement layer 105, the supporting layer 108, and a movable portion. The movable portion includes the upper reflector (second reflector) 116 and a first beam 110 having conductivity, which is driven in the Z-direction, and of which both ends at least in the X-direction are fixed.

Furthermore, as illustrated in FIG. 5A, the movable portion includes the second beam 114 connecting the upper reflector 116 and the first beam 110. The upper reflector 116 is a movable mirror, and is disposed in the opening portion 130 of the first beam 110. In addition, the upper reflector 116 is supported on the first beam 110 by the second beam 114 extending in the Y-direction of the first beam 110.

As illustrated in FIG. 5B, the space 140 is formed between the upper reflector 116 and the upper spacer layer 104. The first beam 110 is supported by the supporting layer 108. In addition, the first electrode 118 is formed below the substrate 100. The first beam 110 has conductivity, and also serves as a second electrode.

In addition, the third electrode 113 is formed on the upper spacer layer 104 (refer to FIG. 5A). By applying voltage to between the first electrode 118 and the third electrode 113, an electron is supplied from the first electrode 118 to the active layer 103 via the substrate 100, the lower reflector 101, and the lower spacer layer 102. On the other hand, a hole is supplied from the third electrode 113 to the active layer 103 via the upper spacer layer 104 and the low resistance region 120 of the current confinement layer 105. As a result, the electron and the hole are recombined in the active layer 103, and light emission occurs in the active layer 103.

In addition, the third electrode 113 is an electrode that forms a pair with the first beam 110 serving as the second electrode, for driving the first beam 110. In other words, by applying alternating-current voltage to between the first beam 110 serving as the second electrode and the third electrode 113, the first beam 110 oscillates in the Z-direction. As a result, the upper reflector 116 also oscillates in the Z-direction, and a cavity length of a pair of reflectors constituted by the lower reflector 101 and the upper reflector 116 varies. Accordingly, in the light emitted in the active layer 103, light with a specific wavelength corresponding to the cavity length is emitted to the outside. In this manner, the oscillation wavelength of the surface emission laser becomes variable.

In the present exemplary embodiment, the upper reflector 116 is supported by the first beam 110 and the second beam 114. In addition, the upper reflector 116 is not supported by the first beam 110 in the X-direction. As illustrated in FIG. 5A, a length T in the X-direction of the first beam 110 of the second beam 114 is smaller than a length L in the X-direction of the upper reflector 116. Furthermore, the upper reflector 116 is configured not to be electrically connected to the first beam 110. Specifically, a volume resistivity of the upper reflector 116 is larger than a volume resistivity of the first beam 110. More specifically, the volume resistivity of the upper reflector 116 is equal to or larger than $1 \times 10^5$ Ωcm. In addition, the volume resistivity of the first beam 110 is equal to or less than $1 \times 10^2$ Ωcm. In other words, the volume resistivity of the upper reflector 116 is larger than the volume resistivity of the first beam 110 by $10^3$ times or more. The upper reflector 116 and the second beam 114 do not contain dopant for enhancing carrier mobility. Alternatively, even if the upper reflector 116 and the second beam 114 contain such dopant, a doping concentration is at such a degree as not to have a function of enhancing carrier mobility. On the other hand, the first beam 110 is configured to contain dopant to such a degree as to have a function of enhancing carrier mobility.

In addition, it is sufficient that the upper reflector 116 is configured not to be electrically connected to the first beam 110. Thus, it is sufficient that the volume resistivity of the second beam 114 is larger than the volume resistivity of the first beam 110. In other words, it is sufficient that the volume resistivity of the second beam 114 is larger than the volume resistivity of the first beam 110, and is equal to or larger than $1 \times 10^5$ Ωcm, even if the volume resistivity of the upper reflector 116 is less than $1 \times 10^5$ Ωcm, and is equal to the volume resistivity of the first beam 110. A scanning spreading resistance microscopy can be used as a method for measuring electrical resistance.

Figure 5C:
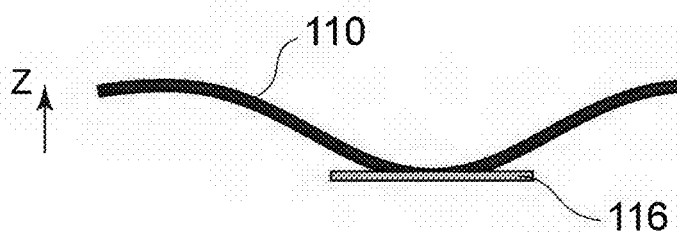

FIG. 5C is a diagram illustrating the movable portion during driving, viewed in the Y-direction. As seen from FIG. 5C, in a state in which the first beam 110 is Pulled toward the side of the active layer 103, the shape of a part of the first beam 110 at the central part in the longitudinal direction of the first beam 110 differs from the shape of the upper reflector 116. Specifically, the distortion of the shape of the upper reflector 116 becomes smaller than that of the shape of the part of the first beam 110 at the central part in the X-direction of the first beam 110. This principle will be described below.

If voltage is applied to between the first beam 110 serving as the second electrode and the third electrode 113, because the both ends in the longitudinal direction of the first beam 110 are fixed, the central part of the first beam 110 is pulled toward the side of the active layer 103 by electrostatic attractive force. Thus, the first beam 110 deforms as illustrated in FIG. 5C.

On the other hand, because the upper reflector 116 is not electrically connected to the first beam 110, the upper reflector 116 is not charged even if voltage is applied to between the third electrode 113 and the first beam 110. In addition, because the upper reflector 116 is connected to the first beam 110 only via the second beam 114, the upper reflector 116 receives almost no influence of the deformation of the first beam 110. Thus, even if the first beam 110 deforms during driving as illustrated in FIG. 5C, the deformation of the upper reflector 116 is suppressed. As a result, a decline in reflectance that is caused by the deformation of the upper reflector 116 during driving is suppressed, and an increase in lasing threshold is suppressed, so that the VCSEL can be stably oscillated even during driving of the movable portion.

In addition, a portion of the upper reflector 116 that is not connected to the second beam 114 can freely oscillate. Thus, if the upper reflector 116 and the first beam 110 are electrically connected, the portion of the upper reflector 116 that is not connected to the second beam 114 freely oscillates due to electrostatic attractive force. The upper reflector 116 accordingly deforms.

(Manufacturing Method)

Next, an example of a manufacturing method of the MEMS-VCSEL according to the present exemplary embodiment will be described using FIGS. 6A to 6E. Each of the drawings illustrates schematic diagrams corresponding to Cross-Section A-A' and Cross-Section B-B' in FIG. 5A. In addition, the following description will be given using an example in which the upper reflector is formed of an HCG. Nevertheless, the upper reflector is not limited to this.

Figure 6A:
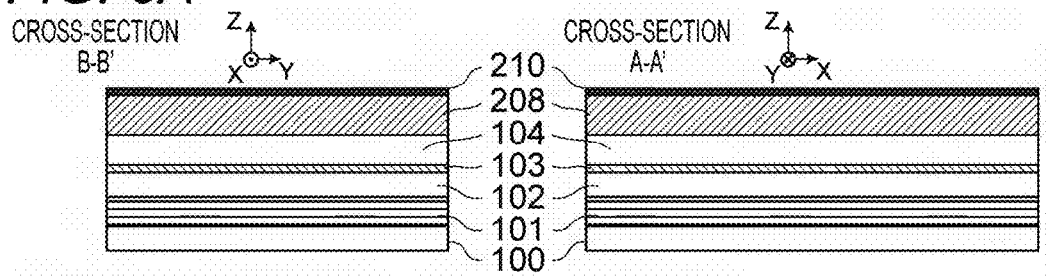
FIGS. 6A to 6E are schematic diagrams illustrating an example of a manufacturing method of the MEMS-VCSEL according to the third and fourth exemplary embodiments.

First, as illustrated in FIG. 6A, a structural body including, on the substrate 100, the lower reflector 101, the lower spacer layer 102, the active layer 103, the upper spacer layer 104, the sacrificial layer 208, and the beam precursor layer 210 is prepared. For preparing the structural body, each layer may be formed on the substrate 100, or may be purchased. Examples of the method for forming each layer include a method of performing crystal growth using a metalorganic chemical vapor deposition (MOCVD) or a molecular beam epitaxy (MBE). In the present exemplary embodiment, the beam precursor layer 210 is doped with a donor such as Si, and has conductivity. A volume resistivity of the beam precursor layer 210 is preferably set to be equal to or less than $1 \times 10^2$ Ωcm.

Figure 6B:
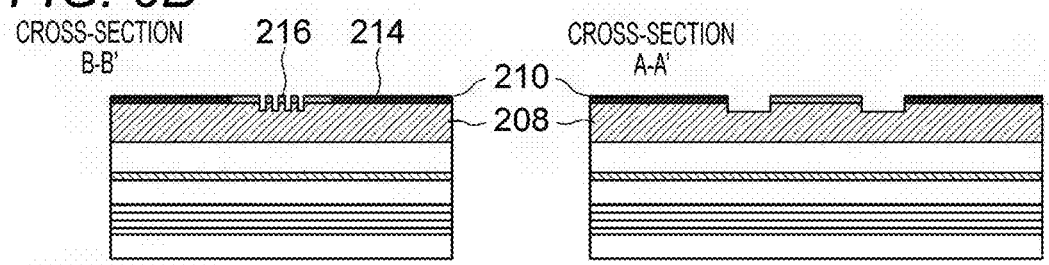

Next, as illustrated in FIG. 6B, processing for increasing resistance of a portion 216 of the beam precursor layer 210 that is to become the upper reflector and the second beam is performed. Specifically, oxygen ion implantation is performed on the portion 216 to become the upper reflector and the second beam, to increase the resistance thereof. A volume resistivity of another Portion 214 remains low. In addition, the processing for increasing resistance is not limited to this. In addition, only the resistance of a portion to become the second beam may be increased. The volume resistivity of the portion 216 with increased resistance is preferably set to be equal to or larger than $1 \times 10^5$ Ωcm. Through the process, the upper reflector and the first beam can be configured not to be electrically connected.

Then, portions of the beam precursor layer 210 excluding the portion 216 to become the upper reflector and the second beam and a portion to become the first beam are removed (refer to Cross-Sectional Diagram A-A'). In addition, a portion of the beam precursor layer 210 that is to become a low refractive index portion of the HCG is also removed (refer to Cross-Sectional Diagram B-B'). In addition, these 2 removal processes may be simultaneously performed. A slit pattern to become the low refractive index portion of the HCG can be formed by an electron beam drawing apparatus. In addition, the removal process of the beam precursor layer 210 can be performed using dry etching. In addition, in FIG. 6B, not only the beam precursor layer 210 but also part of the sacrificial layer 208 is removed. Nevertheless, only the beam precursor layer 210 may be removed.

Figure 6C:
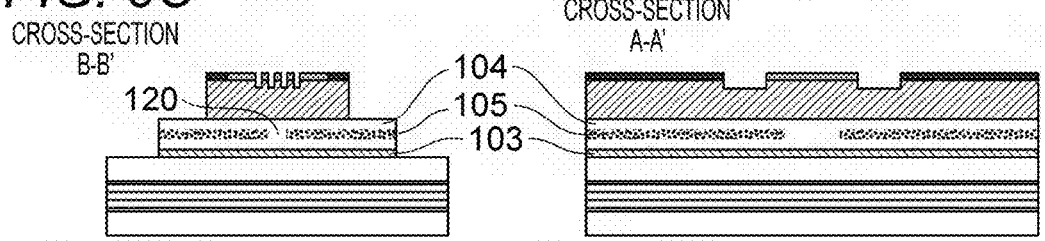

Next, as illustrated in FIG. 6C, the beam precursor layer 210 and part of the sacrificial layer 208 are removed while leaving a pattern corresponding to the movable portion (first beam, second beam, upper reflector). In this removal process, dry etching, wet etching, or a combination thereof may be used.

Then, the upper spacer layer 104 and part of the active layer 103 are removed while leaving a pattern for forming the third electrode on the upper spacer layer 104. In this removal process, photolithography and wet etching are used. In addition, in this removal process, in FIG. 6C, the side surface of the active layer is exposed. Nevertheless, the side surface of the lower spacer layer 102, and furthermore, part or all of the side surface of the lower reflector 101 may be exposed. In this removal process, it is only required to expose the side surface of a layer to become the current confinement layer to be formed in the next process.

Next, in high-temperature water vapor atmosphere, a partial layer of the upper spacer layer 104 is oxidized from its side surface to form the current confinement layer 105 in the upper spacer layer 104. The low resistance region 120 of the current confinement layer 105 remains unoxidized. This low resistance region 120 corresponds to the light emission region in the active layer 103 and a portion of the beam precursor layer 210 that is to become the upper reflector.

Figure 6D:
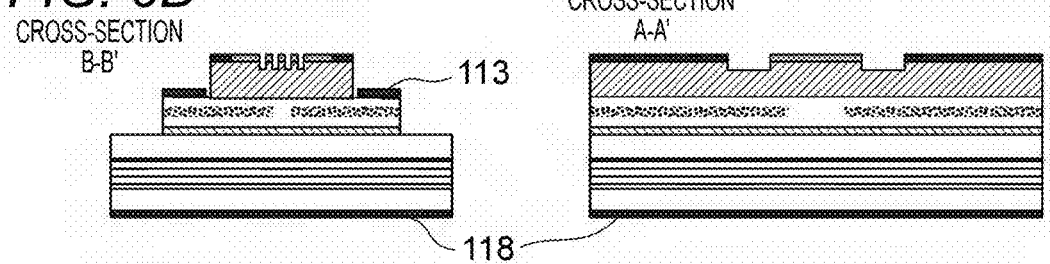

Next, as illustrated in FIG. 6D, the first electrode 118 is formed below the substrate 100 and the third electrode 113 is formed on the upper exposed surface of the upper spacer layer 104.

Figure 6E:
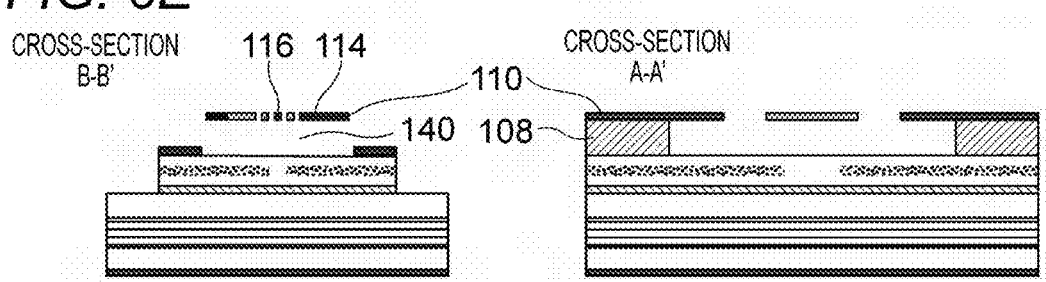

Lastly, as illustrated in FIG. 6E, the sacrificial layer 208 is removed while leaving a portion to become the supporting layer 108. As a result, the first beam 110, the second beam 114, the upper reflector 116, and the space 140 are formed. In this removal process, wet etching is used.

In addition, in any of the above-described removal processes, a mask layer may be appropriately provided. In addition, an MEMS-VCSEL manufactured using a method other than the above-described method is included in the present disclosure.

Fourth Exemplary Embodiment

In the present exemplary embodiment, a manufacturing method is different from that in the third exemplary embodiment, and the configuration is the same as that in the third exemplary embodiment. The following description will be given mainly of a difference from the third exemplary embodiment. In addition, the manufacturing method according to the present exemplary embodiment will also be described using FIGS. 6A to 6E.

First, as illustrated in FIG. 6A, a stacked body is prepared similarly to the third exemplary embodiment. Nevertheless, in the present exemplary embodiment, unlike the third exemplary embodiment, the beam precursor layer 210 is not doped with dopant serving as a donor, and a volume resistivity is set to be equal to or larger than $1 \times 10^5$ Ωcm.

Next, as illustrated in 6B, a portion 214 of the beam precursor layer 210 that is other than the portion 216 to become the upper reflector and the second beam, and is to become the first beam is doped with ion serving as a donor such as Si. Then, by performing annealing treatment at high temperature, a volume resistivity of the portion 214 to become the first beam can be made lower. Specifically, it is preferable to set the volume resistivity of the portion 214 to become the first beam, to be equal to or less than $1 \times 10^2$ Ωcm. In addition, the donor doping is performed in such a manner that a region in which a volume resistivity becomes equal to or large than $1 \times 10^5$ Ωcm extends at least from one end in the X-direction of the first beam to the other end thereof. In this manner, the first beam 110 is configured to have conductivity.

The processes performed thereafter are similar to those in the third exemplary embodiment. Through the above-described processes, the following configuration can be obtained. More specifically, during the driving of the movable portion, no electrostatic attractive force is generated in the upper reflector 116, and furthermore, the upper reflector 116 is inhibited from receiving the influence of the deformation of the first beam 110. As a result, an effect similar to that of the third exemplary embodiment can be obtained.

Other Exemplary Embodiments

Aside from the above-described OCT apparatus, the surface emission laser according to the first exemplary embodiment can also be used as an optical communication light source and an optical measurement light source. In addition, a plurality of VCSEL structures to which the first exemplary embodiment is applied may be arranged on the same plane to be used as a light source array.

EXAMPLE

Example 1

Example 1 of the present disclosure will be described below. In this example, a manufacturing method and a configuration of an MEMS-VCSEL will be described based on FIG. 1A to 1C or 2A to 2E. In this example, an MEMS-VCSEL with an oscillation wavelength of 1.06 μm will be described.

First, as illustrated in FIG. 2A, 50 pairs of $Al_xGa_{1-x}As$/ GaAs (0.2≤X≤1) are stacked on the n-GaAs substrate 100 to form the lower reflector 101. Then, the lower spacer layer 102, the active layer 103, the upper spacer layer 104 including an AlGaAs layer, the GaAs sacrificial layer 208 with a thickness of 1.00 μm, and the beam precursor layer 210 with $Al_xGa_{1-x}As$ (x-=0.7) are sequentially stacked using the MOCVD or the like. The beam precursor layer 210 does not contain dopant for enhancing carrier mobility, and a volume resistivity is set to $2 \times 10^8$ Ωcm.

Next, as illustrated in FIG. 2B, portions of the beam precursor layer 210 excluding the portion 216 to become the upper reflector and the second beam, and a portion of the beam precursor layer 210 that is to become the low refractive index portion of the HCG are removed by dry etching. In addition, the grating of the HCG is formed by an electron beam drawing apparatus with 255 nmL/S.

Then, as illustrated in FIG. 2C, the beam precursor layer 210 and part of the sacrificial layer 208 are removed by dry etching while leaving a pattern corresponding to the movable portion (first beam, second beam, upper reflector). Then, the upper spacer layer 104 and part of the active layer 103 are removed by photolithography and wet etching while leaving a pattern for forming the third electrode on the upper spacer layer 104. Next, in high-temperature water vapor atmosphere, a partial layer of the upper spacer layer 104 is oxidized from its side surface to form the current confinement layer 105 in the upper spacer layer 104.

Next, as illustrated in FIG. 2D, the first electrode 118 made of AuGe/Ni/Au is formed below the substrate 100. In addition, the second electrode made of Ti/Au is formed on the region of the beam precursor layer 210 that is to become the first beam. In addition, the third electrode 113 made of Ti/Au is formed on the upper exposed surface of the upper spacer layer 104.

Lastly, as illustrated in FIG. 2E, the sacrificial layer 208 is removed while leaving a portion to become the supporting layer 108, by wet etching using etchant made of mixed solution of citric acid and hydrogen peroxide. As a result, the first beam 110, the second beam 114, the upper reflector 116, and the space 140 are formed.

In this manner, the MEMS-VCSEL illustrated in FIGS. 1A to 1C is manufactured. Specifically, the MEMS-VCSEL includes, on the substrate 100, the lower reflector 101, the lower spacer layer 102, the active layer 103, the upper spacer layer 104, the current confinement layer 105, the supporting layer 108, and the movable portion. The movable portion includes the upper reflector 116, the first beam 110, which is driven in the Z-direction, and of which both ends at least in the X-direction are fixed, and the second beam 114 connecting the upper reflector 116 and the first beam 110. The movable portion is disposed on the upper spacer layer 104 via the space 140.

The upper reflector 116 and the second beam 114 are disposed in the opening portion 130 of the first beam 110. In addition, the upper reflector 116 is connected to the first beam 110 by the second beam 114 extending in the Y-direction of the first beam 110. A length in the X-direction of the first beam 110 of the second beam 114 is smaller than a length in the X-direction of the first beam 110 of the upper reflector 116. The upper reflector 116 is configured not to be electrically connected to the second electrode 112 disposed on the first beam 110.

As a result, even if voltage is applied to between the second electrode 112 and the third electrode 113, and the first beam 110 is driven in the −Z-direction, the deformation of the upper reflector 116 can be suppressed.

Example 2

Example 2 of the present disclosure will be described below. In this example, a manufacturing method and a configuration of an MEMS-VCSEL will be described based on FIG. 5A to 5C or 6A to 6E. In this example, an MEMS-VCSEL with an oscillation wavelength of 1.06 μm will be described.

First, as illustrated in FIG. 6A, 50 pairs of $Al_xGa_{1-x}As$/GaAs ($0.2 \leq X \leq 1$) are stacked on the n-GaAs substrate 100 to form the lower reflector 101. Then, the lower spacer layer 102, the active layer 103, the upper spacer layer 104 including an AlGaAs layer, the GaAs sacrificial layer 208 with a thickness of 1.00 μm, and the beam precursor layer 210 with $Al_xGa_{1-x}As$ (x=0.7) are sequentially stacked using the MOCVD or the like. When the beam precursor layer 210 is formed, the beam precursor layer 210 is doped with Si, and a volume resistivity is set to $8 \times 10^{-3}$ Ωcm.

Next, as illustrated in FIG. 6B, resistance of the portion 216 of the beam precursor layer 210 that is to become the upper reflector and the second beam is increased. Specifically, oxygen ion implantation is performed on the portion 216 to set the volume resistivity of the portion 216 to $2 \times 10^8$ Ωcm.

Next, portions of the beam precursor layer 210 excluding the portion 216 to become the upper reflector and the second beam, and a portion of the beam precursor layer 210 that is to become the low refractive index portion of the HCG are removed by dry etching. In addition, the grating of the HCG is formed by an electron beam drawing apparatus with 255 nmL/S.

Then, as illustrated in FIG. 6C, the beam precursor layer 210 and part of the sacrificial layer 208 are removed by dry etching while leaving pattern corresponding to the movable portion (first beam, second beam, upper reflector). Then, the upper spacer layer 104 and part of the active layer 103 are removed by photolithography and wet etching while leaving a pattern for forming the third electrode on the upper spacer layer 104. Next, in high-temperature water vapor atmosphere, a partial layer of the upper spacer layer 104 is oxidized from its side surface to form the current confinement layer 105 in the upper spacer layer 104.

Next, as illustrated in FIG. 6D, the first electrode 118 made of AuGe/Ni/Au is formed below the substrate 100. In addition, the third electrode 113 made of Ti/Au is formed on the upper exposed surface of the upper spacer layer 104.

Lastly, as illustrated in FIG. 6E, the sacrificial layer 208 is removed while leaving a portion to become the supporting layer 108, by wet etching using etchant made of mixed solution of citric acid and hydrogen peroxide. As a result, the first beam 110, the second beam 114, the upper reflector 116, and the space 140 are formed.

In this manner, the MEMS-VCSEL illustrated in FIGS. 5A to 5C is manufactured. Specifically, the MEMS-VCSEL includes, on the substrate 100, the lower reflector 101, the lower spacer layer 102, the active layer 103, the upper spacer layer 104, the current confinement layer 105, the supporting layer 108, and the movable portion. The movable portion includes the upper reflector 116, the first beam 110 having conductivity, which is driven in the Z-direction, and of which both ends at least in the X-direction are fixed, and the second beam 114 connecting the upper reflector 116 and the first beam 110. The movable portion is disposed on the upper spacer layer 104 via the space 140.

The upper reflector 116 and the second beam 114 are disposed in the opening portion 130 of the first beam 110. In addition, the upper reflector 116 is supported on the first beam 110 by the second beam 114 extending in the Y-direction of the first beam 110. A length in the X-direction of the first beam 110 of the second beam 114 is smaller than a length in the X-direction of the first beam 110 of the upper reflector 116. The upper reflector 116 is configured not to be electrically connected to the first beam 110.

As a result, even if voltage is applied to between the first beam 110 serving as the second electrode and the third electrode 113, and the first beam 110 is driven in the −Z-direction, the deformation of the upper reflector 116 can be suppressed.

While the present disclosure has been described with reference to exemplary embodiments, it is to be understood that the disclosure not limited to the disclosed exemplary embodiments. The scope of the following claims is to be accorded the broadest interpretation so as to encompass all such modifications and equivalent structures and functions.

This application claims the benefit of Japanese Patent Application No. 2015-140050, filed Jul. 13, 2015, and Japanese Patent Application No. 2015-140051, filed Jul. 13, 2015, which applications are hereby incorporated by reference herein in their entireties.

What is claimed is:

1. A surface emission laser comprising:
a first reflector;
an active layer disposed on the first reflector;
a first beam disposed on the active layer via a space;
a second reflector disposed in an opening portion formed in the first beam;
a second beam disposed in the opening portion, and extending in a widthwise direction of the first beam to connect the second reflector and the first beam;
a first electrode disposed on, or included in or part of, the first beam; and
a second electrode disposed in between a portion of the active layer and a portion of the first electrode,
wherein both ends, at least in a longitudinal direction, of the first beam are fixed ends,
wherein a length, in the longitudinal direction of the first beam; of the second beam is smaller than a length, in the longitudinal direction of the first beam, of the second reflector, and
wherein the second reflector is not electrically connected to the first electrode.

2. The surface emission laser according to claim 1, wherein the first electrode is formed to be connected to, or included in or apart of, the first beam in the longitudinal direction.

3. The surface emission laser according to claim 1, wherein a volume resistivity of the first beam is equal to or larger than $1 \times 10^5$ Ωcm.

4. The surface emission laser according to claim 1, wherein the first electrode and the second electrode form a pair and operate to drive the first beam in response to a voltage being applied between the first electrode and the second electrode.

5. The surface emission laser according to claim 1, wherein the second reflector is not electrically connected to the first beam.

6. The surface emission laser according to claim 5, wherein a volume resistivity of the second beam is larger than a volume resistivity of the first beam.

7. The surface emission laser according to claim 5, wherein a volume resistivity of the second reflector is larger than a volume resistivity of the first beam.

8. The surface emission laser according to claim 5, wherein a volume resistivity of the first beam is equal to or less than $1 \times 10^2$ Ωcm.

9. The surface emission laser according to claim 5, wherein the first electrode and the second electrode form a pair and operate to drive the first beam, in response to a voltage being applied between the first electrode and the second electrode, such that the first beam oscillates in a direction perpendicular or substantially perpendicular to the longitudinal direction of the first beam.

10. The surface emission laser according to claim 1, wherein a volume resistivity of the second beam is equal to or larger than $1 \times 10^5$ Ωcm.

11. The surface emission laser according to claim 1, wherein a volume resistivity of the second reflector is equal to or larger than $1 \times 10^5$ Ωcm.

12. The surface emission laser according to claim 1, wherein the opening portion is positioned at a central part in the longitudinal direction of the first beam, and wherein the second beam connects the first beam and the second reflector at the central part in the longitudinal direction of the first beam of the opening portion.

13. The surface emission laser according to claim 1, wherein the second reflector is a diffractive grating.

14. The surface emission laser according to claim 13, wherein a grating of the diffractive grating is periodically arranged in the widthwise direction of the first beam.

15. The surface emission laser according to claim 1, wherein, in a state in which the first beam is pulled toward a side of the active layer, when viewed in the widthwise direction of the first beam, a shape of a part of the first beam at a central part in the longitudinal direction of the first beam differs from a shape of the second reflector.

16. The surface emission laser according to claim 15, wherein, in a state in which the first beam is pulled toward the side of the active layer, distortion of a shape of the second reflector is smaller than that of the shape of the part of the first beam at the central part in the longitudinal direction of the first beam.

17. The surface emission laser according to claim 1, wherein the second reflector is not supported by the first beam in the longitudinal direction of the first beam.

18. An imaging apparatus comprising:
the surface emission laser according to claim 1;
an interference optical system configured to branch light from the surface emission laser, into illumination light to be emitted onto a measurement target object, and reference light, and to generate interfering light by reflected light of light emitted on the measurement target object and the reference light;
a light detection unit configured to receive the interfering light; and
an information acquisition unit configured to acquire information of the measurement target object based on a signal from the light detection unit.

19. A surface emission laser comprising:
a first reflector;
an active layer disposed on the first reflector;
a beam disposed on the active layer via a space;
a second reflector supported by the beam;
a first electrode disposed on, or included in or part of, the beam; and
a second electrode disposed in between a portion of the active layer and a portion of the first electrode,
wherein the surface emission laser has such a structure that, in a state in which a first beam is pulled toward a side of the active layer, deformation in an in-plane direction of the second reflector becomes smaller than deformation in an in-plane direction of the beam excluding a region in which the second reflector is disposed, and
wherein the second reflector is not electrically connected to the first electrode.

20. The surface emission laser according to claim 1, further comprising an upper spacer layer disposed between the first beam and the active layer, wherein at least one portion of the upper spacer layer extends laterally beyond at least one side of, or the width of, the first beam and the second electrode is disposed on the at least one portion of the upper spacer layer.

21. The surface emission laser according to claim 20, wherein the upper space layer operates to provide a hole from the second electrode to the active layer.

22. The surface emission laser according to claim 21, further comprising a current confinement layer having a low resistance region positioned between the second reflector and the active layer, the low resistance region of the current confinement layer operating to provide a hole in between the active layer and the second electrode.

23. The surface emission laser according to claim 21, further comprising an additional electrode such that the active layer is disposed between the additional electrode and the first and second electrodes, wherein, in response to a voltage applied between the additional electrode and the second electrode, the additional electrode operates to supply an electron from the additional electrode to the active layer, the electron and the hole are recombined in the active layer, and light emission occurs in the active layer.

* * * * *